(12) United States Patent
Baba

(10) Patent No.: US 6,342,806 B1
(45) Date of Patent: *Jan. 29, 2002

(54) STRUCTURE OF A FLOATING GATE OF A MOS TRANSISTOR AND METHOD OF CHANGING THE THRESHOLD VALUE THEREOF

(75) Inventor: Syunsuke Baba, Tokyo (JP)

(73) Assignee: Oki Electric Industry CO, Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/354,702

(22) Filed: Jul. 16, 1999

(30) Foreign Application Priority Data

Jul. 17, 1998 (JP) ............................................ 10-203467

(51) Int. Cl.$^7$ ............................................... H03K 17/687
(52) U.S. Cl. .................... 327/434; 365/185.24
(58) Field of Search ...................... 365/185.1, 185.05, 365/185.14, 185.15, 185.24, 185.26; 327/434

(56) References Cited

U.S. PATENT DOCUMENTS

| | | | |
|---|---|---|---|
| 5,289,401 A | * | 2/1994 | Shima .......................... 365/45 |
| 5,311,470 A | * | 5/1994 | Atsumi et al. .......... 365/189.05 |
| 5,329,487 A | * | 7/1994 | Gupta et al. ................. 365/185 |

* cited by examiner

Primary Examiner—Jung Ho Kim
(74) Attorney, Agent, or Firm—Rabin & Berdo, P.C.

(57) ABSTRACT

An object of the present invention is to economize in power consumption of a semiconductor integrated circuit. The semiconductor integrated circuit has first and second capacitors electrically connected to a control electrode of a transistor. The first capacitor is used to input a signal therein and the second capacitor is used to change a threshold value relative to the input signal.

14 Claims, 6 Drawing Sheets

STRUCTURE OF A FLOATING GATE OF A MOS TRANSISTOR AND METHOD OF CHANGING THE THRESHOLD VALUE THEREOF

BACKGROUND OF THE INVENTION

1. Field of the Invention

This invention relates to a semiconductor integrated circuit, and particularly to the economy of power consumption thereby.

2. Description of the Related Art

With miniaturization of a semiconductor devices, the need for a reduction in their source voltages has been increased in recent years. With a view toward obtaining a sufficient operating speed when the source is in a lowered state, there is a need to reduce a threshold voltage of each MOSFET which constitutes an internal circuit.

Even when a voltage for bringing each MOSFET low in threshold current to an OFF state is supplied to the gate thereof, a small leakage current will flow in the MOSFET according to the voltage applied between the source and drain thereof. The leakage current will increase power consumption even during standby or the like.

The following have heretofore been known as circuits for reducing power consumption of the semiconductor device.

According to one circuit, an internal circuit was made up of MOSFETs low in threshold voltage, and MOSFETs high in threshold voltage were respectively inserted between Vcc and virtual Vcc and GND and virtual GND. In such a construction, the MOSFETs high in threshold voltage, which have been inserted between Vcc and virtual Vcc and GND and virtual GND, were respectively brought to an off state upon a standby state of the semiconductor device. A leakage current developed between Vcc and GND has been cut by this operation.

According to another circuit, a substrate potential in an internal circuit was changed upon both its standby and operation so as to change a threshold voltage of each MOSFET itself.

However, the system for inserting the MOSFETs between Vcc and virtual Vcc and GND and virtual GND has encountered difficulties in ensuring the stability of internal data. Further, the system for changing the substrate potential had problems such as the occurrence of a latch-up phenomenon, etc.

SUMMARY OF THE INVENTION

With the foregoing problems in view, it is therefore an object of the present invention to provide a circuit low in power consumption and stable in operation, and a method of reducing power consumption of the circuit.

According to one aspect of the invention, for achieving the above object, there is provided a semiconductor integrated circuit, comprising a first capacitor having one electrode electrically connected to a control electrode of a transistor and the other electrode supplied with an input signal with respect to the transistor, and a second capacitor having one electrode electrically connected to the control electrode of the transistor and the other electrode supplied with a predetermined voltage thereby to change a threshold value of the transistor relative to the input signal.

According to another aspect of the invention, for achieving the above object, there is provided a method of economizing in power consumption of a semiconductor integrated circuit, comprising the following steps: supplying a first predetermined voltage to the other electrode of a first capacitor whose one electrode is connected to a control electrode of a transistor, upon normal operation of the semiconductor integrated circuit; supplying an input signal to the other electrode of a second capacitor whose one electrode is connected to a control electrode of the transistor; and supplying a second predetermined voltage to the other electrode of the first capacitor thereby to increase a threshold voltage of the transistor with respect to the input signal upon a standby state of the semiconductor integrated circuit.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

[First embodiment]

Figure 1:
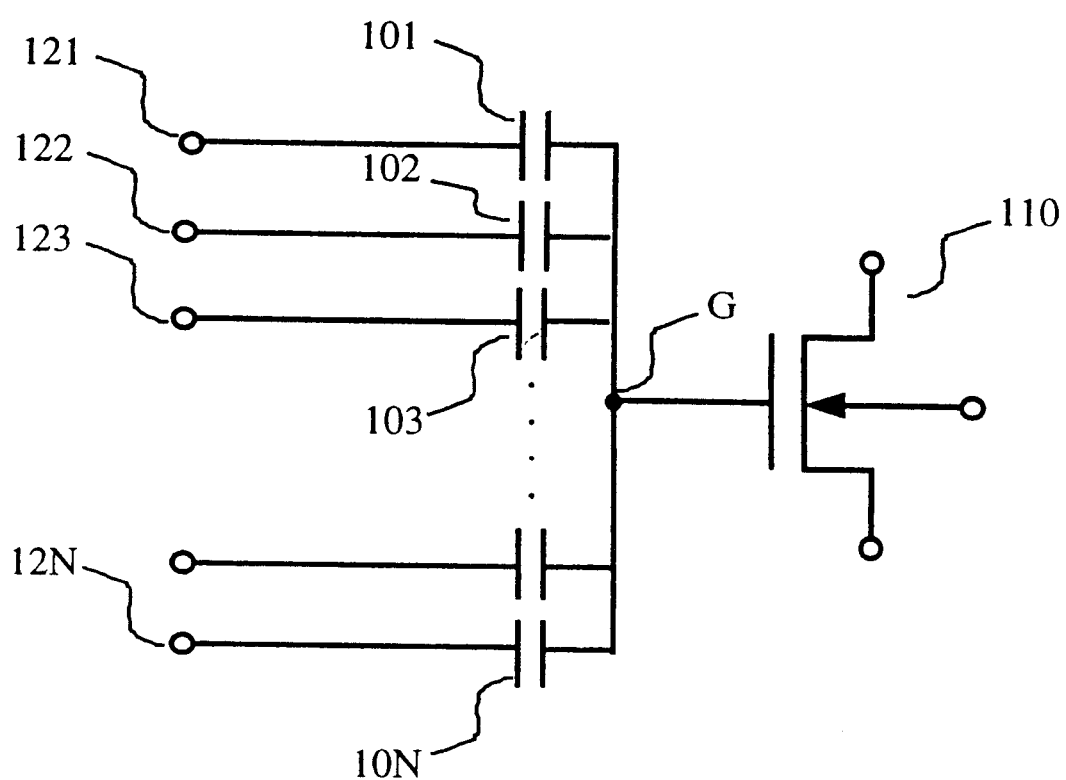
FIG. 1 is a circuit diagram showing a first embodiment of the present invention.

FIG. 1 is a circuit diagram for describing a basic operation of a low power consumption circuit according to a first embodiment of the present invention.

In the first embodiment, N capacitors 101 through 10N are respectively electrically parallel-connected to a gate electrode of an N MOSFET 110. At least one terminal of terminals 121 through 12N on the electrode sides of the capacitors 101 through 10N, which are not connected to the N MOSFET 110, serves as a data input terminal. The terminals other than the data input terminal serve as operation control terminals. The capacitance of the gate of the N MOSFET 110 will be defined as Cg, and the capacitances of the capacitors 101 through 10N will be defined as $C_1$ through $C_N$ respectively.

The operation of the low power consumption circuit according to the first embodiment of the present invention will be explained with reference to FIG. 1.

When the total capacitance of the circuit shown in FIG. 1 is expressed as $C_{TOTAL}$, $C_{TOTAL}$ is given by the following equation:

$$C_{TOTAL}=C_T \cdot Gg/(C_T+Cg)(C=C_1+C_2+C_3+\ldots +C_N)$$

Assuming that voltages applied to the terminals 121 through 12N are represented as $V_1$ through $V_N$ respectively, a voltage $V_\phi$ (corresponding to a voltage applied to a node G in FIG. 1) applied to the gate electrode of the N MOSFET 110 is given by the following equation:

$$V_\phi\square=(C_1V_1+C_2V_2+C_3V_3+\ldots+C_NV_N)/C_{TOTAL}$$

If this voltage reaches a value greater than or equal to a threshold voltage Vth of the N MOSFET 110, then the N MOSFET 110 is brought to an on state.

The operation of the circuit shown in FIG. 1 will be described in further detail with reference to FIG. 2.

Figure 2A:
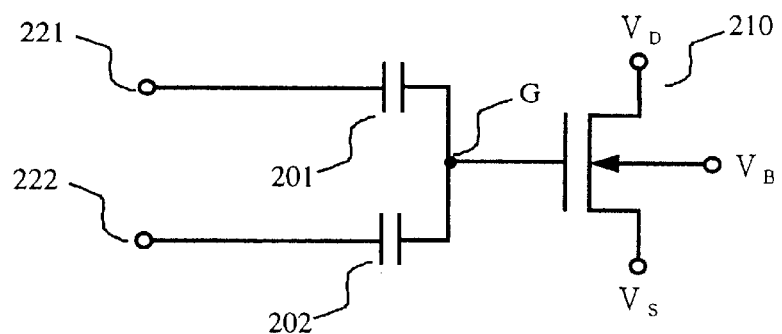
FIG. 2 is a circuit diagram illustrating the first embodiment of the present invention and shows changes in device characteristic.
Figure 2B:
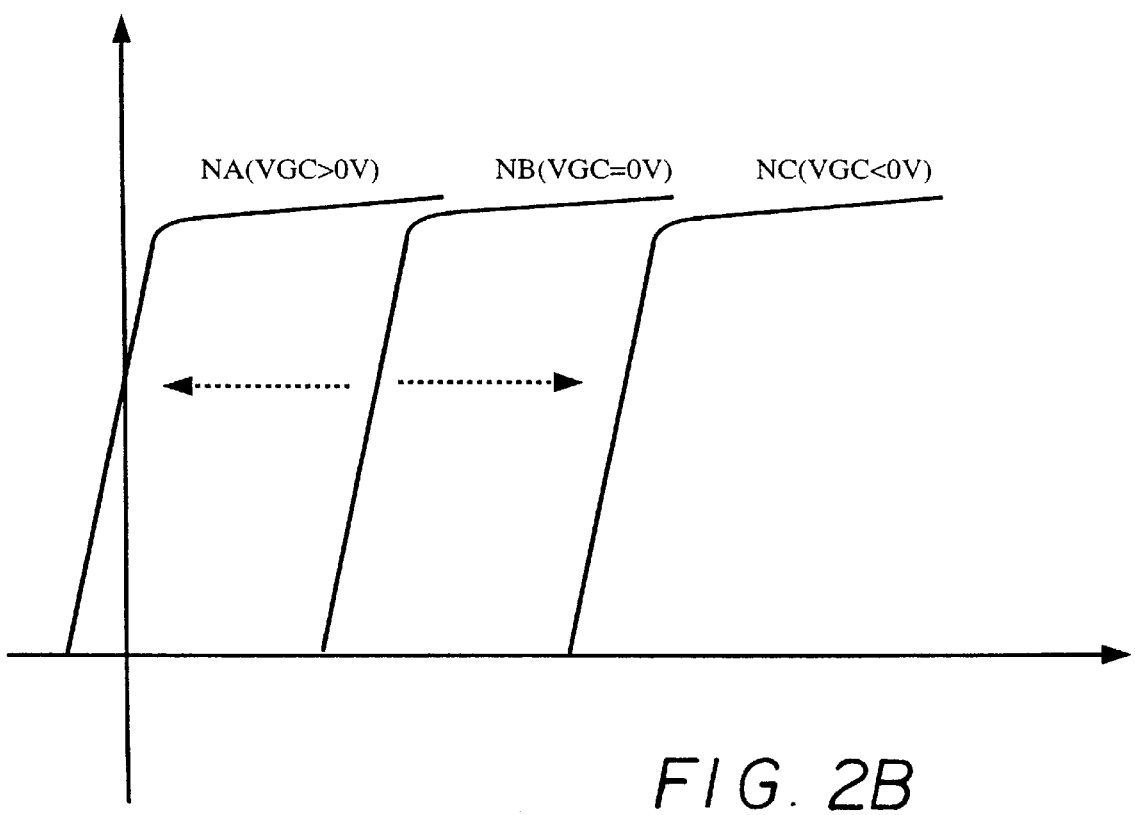

FIG. 2-A is a circuit diagram showing a modification of the circuit shown in FIG. 1 at the time that the number of capacitors connected to the gate in the circuit shown in FIG. 1 is set to two. In FIG. 2-A, the capacitance of the gate of an N MOSFET 210 is defined as Cg, and the capacitances of capacitors 201 and 202 are defined as C1 and C2 respectively. A terminal 221 is supplied with a voltage of VG and a terminal 222 is supplied with a voltage of VGC. Further, the source and drain of the N MOSFET 210 are supplied with voltages of $V_s$ and $V_D$ respectively. A predetermined drain voltage is applied between the source and drain of the N MOSFET 210. A substrate potential will be represented as $V_B$.

The relation between the voltage VG applied to the terminal 221 and a drain current ID is shown in FIG. 2-B.

A description will be made of a case in which the voltage VGC applied to the terminal 222 is 0V. Assuming VGC=0 in the above equation, the drain current ID begins to flow if the voltage VG applied to the terminal 221 is given as follows:

$$Vth<C1\cdot(C1+C2+Cg)/(Cg\cdot(C1+C2)\cdot VG$$

The relation between VG and ID at this time is represented as a characteristic shown as NB in FIG. 2-B.

A description will be made of a case in which the voltage VGC applied to the terminal 222 is a positive voltage. If $$Vth<C1\cdot(C1+C2+Cg)/(Cg\cdot(C1$$
$$+C2)\cdot VG+C2\cdot(C1+C2+Cg)/(Gg\cdot(C1+C2))\cdot VGC$$

from the above equation, then the drain current ID begins to flow. If VGC is given as the positive voltage, then two terms in the above equation result in positive values respectively. Thus, the voltage VG applied to the terminal 221 makes it possible to bring the N MOSFET 210 to an on state at a voltage value lower than that at VGC=0V.

Due to the setting of the positive voltage to VGC, the characteristic curve NB shown in FIG. 2-B is shifted to the left.

The relation between VG and ID at this time is given as a characteristic represented as NA in FIG. 2-B.

When the voltage VGC applied to the terminal 222 is given as a negative voltage, a relationship opposite to the above-described positive voltage of VGC is established. When a voltage higher than that at VGC=0V is applied to the terminal 221, the N MOSFET 210 is turned on. When the negative voltage is set to VGC, the characteristic curve NB shown in FIG. 2 is shifted to the right. The relation between VG and ID is shown as NC in FIG. 2-B.

An input signal for the N MOSFET 210 is supplied to the terminal 221. If the terminal 222 is supplied with a positive voltage, then the N MOSFET 210 is turned on even if the voltage of the input signal supplied to the terminal 221 is low. If the terminal 222 is supplied with a negative voltage in reverse, then the N MOSFET 210 is not turned on unless the voltage of the input signal supplied to the terminal 221 is set high. The application of a predetermined voltage to the terminal 222 makes it possible to change the threshold value of the N MOSFET 210 with respect to the input signal.

Figure 3A:
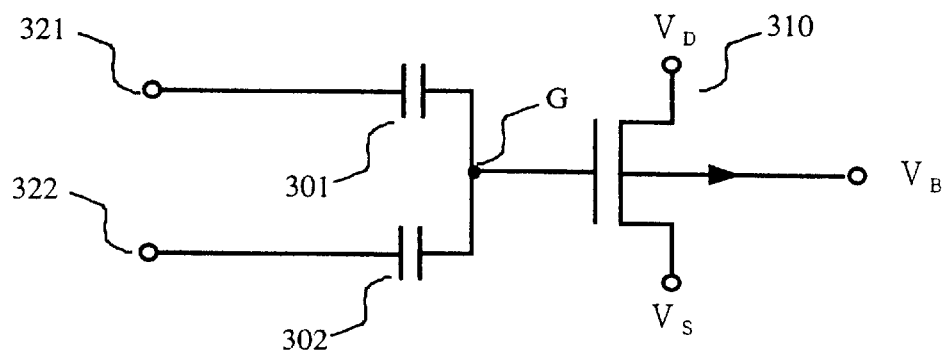
FIG. 3 is a circuit diagram depicting the first embodiment of the present invention and illustrates changes in device characteristic.
Figure 3B:
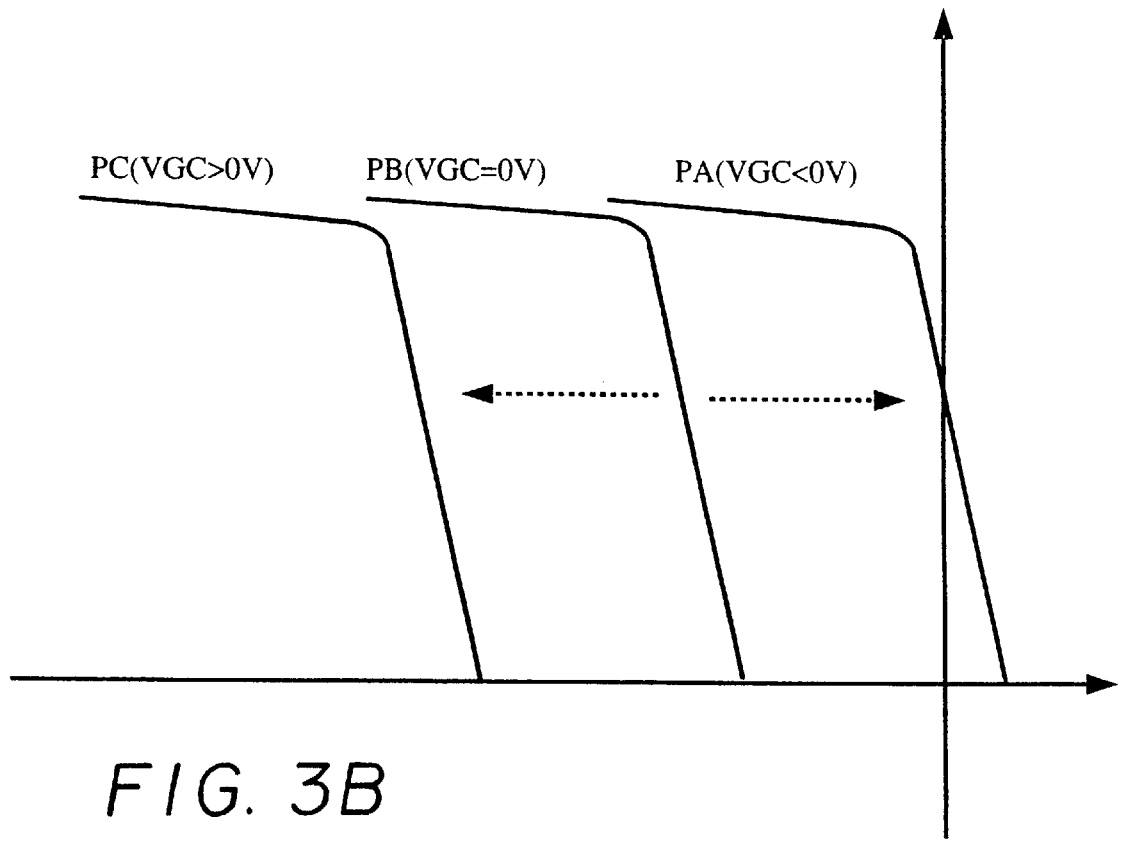

FIGS. 3-A and 3-B are respectively diagrams showing a circuit and its characteristic at the time that the N MOSFET shown in FIG. 2-A is replaced by a P MOSFET. This circuit is illustrated as a circuit opposite in polarity alone and operates in a similar to the N MOSFET. In other words, when a positive voltage VGC is supplied to a terminal 322, a voltage value lower than that at VGC=0V is applied to a terminal 321 as the voltage to be applied to the terminal 321, so that a MOSFET 310 is turned on (see a characteristic shown as PC).

On the other hand, when the voltage VGC applied to the terminal 322 is a negative voltage, the voltage VG applied to the terminal 321 is given as a voltage higher than that at VGC=0V, so that the MOSFET 310 is turned on (see a characteristic represented as PA).

Assuming that an input signal is supplied to the terminal 321, the threshold value of the P MOSFET 310 with respect to the input signal can be varied by the voltage applied to the terminal 322.

Figure 4:
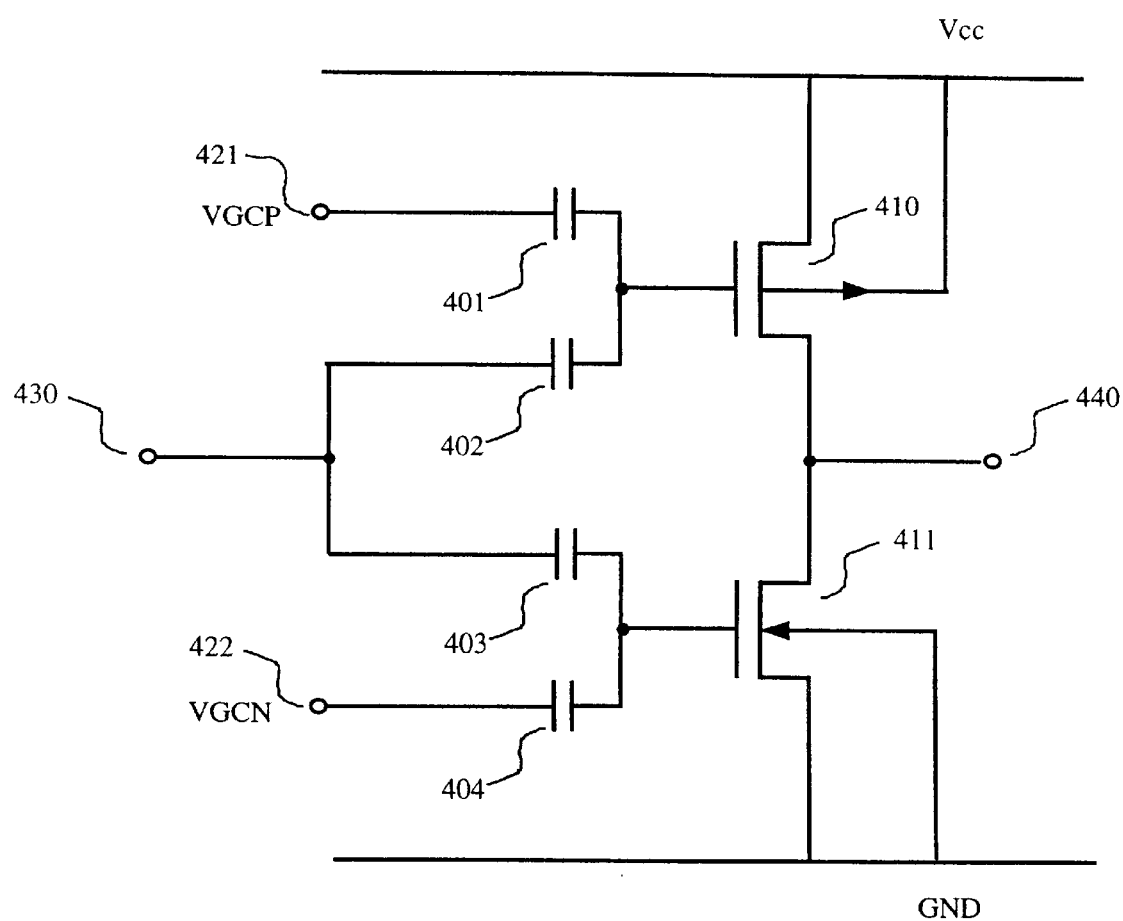
FIG. 4 is a diagram showing an inverter circuit utilizing the first embodiment of the present invention.

An example of an inverter configured by using the N MOSFET shown in FIG. 2-A and the P MOSFET shown in FIG. 3-A will be shown in FIG. 4.

A substrate terminal of a P MOSFET 410 and the source thereof are respectively electrically connected to a source or power supply Vcc. The drain of the P MOSFET 410 is electrically connected to an output terminal 440. Capacitors 401 and 402 are electrically parallel-connected to a gate electrode of the P MOSFET 410. A substrate terminal of an N MOSFET 411 and the source thereof are respectively electrically connected to GND. The drain of the N MOSFET 411 is electrically connected to the output terminal 440. Capacitors 403 and 404 are respectively electrically parallel-connected to a gate electrode of the N MOSFET 411.

Electrodes of the capacitors 402 and 403, which are not connected to the MOSFETs 410 and 411, are electrically connected to an input terminal 430. An electrode of the capacitor 401, which is not connected to the P MOSFET 410, is electrically connected to a control terminal 421 supplied with a control voltage VGCP. An electrode of the capacitor 404, which is-not connected to the N MOSFET 411, is electrically connected to a control terminal 422 supplied with a control voltage VGCN.

When VGCP is 0V, the P MOSFET 410 has such a threshold value as not to exhibit a stable conducting state unless the voltage applied to the input terminal reaches −1V.

Further, when VGCN is 0V, the N MOSFET 411 has such a threshold value as not to exhibit a stable conducting state unless the voltage applied to the input terminal reaches 1V.

The operation of the inverter shown in FIG. 4, which is in its normal condition, will be explained based on the above description. Upon its normal operation, VGCP=VGCN=0V is supplied to both the control terminals 421 and 422 as the control voltage.

The P MOSFET 410 and the N MOSFTET 411 operate according to the level of the voltage applied to the input terminal 430. Since, in this case, the respective MOSFETs 410 and 411 have sufficiently operable threshold values respectively even if the amplitude of the voltage supplied to the input terminal 430 is small, they can be activated at high speed.

The operation of the inverter at its standby will next be described.

In response to the standby state of the inverter circuit, an control voltage generating circuit (not shown) outputs a positive control voltage VGCP and a negative control voltage VGCN. The outputted control voltages VGCP and VGCN are applied to the control terminals 421 and 422 respectively. When the positive voltage VGCP is supplied to the control voltage 421, the P MOSFET 410 varies its characteristic in a manner similar to the characteristic shown in FIG. 3-B. In other words, no current flows in the P MOSFET 410 unless the voltage applied to the input terminal 430 reaches a voltage lower than 0V.

Further, when the negative voltage VGCN is supplied to the control terminal 422, the N MOSFET 411 changes its characteristic too. In other words, no current flows in the N MOSFET 411 unless the voltage applied to the input terminal 430 reaches a voltage higher than 0V. Due to the generation of such voltages during standby, the inverter does not produce a flow of leakage current.

In the circuit according to the present invention, the capacitors are respectively electrically parallel-connected to the gate electrodes of the MOSFETs. The input signal is supplied to at least one terminals of the parallel-connected capacitors and the control voltages are supplied to capacitors other than the capacitors supplied with the input signal. The threshold values of the MOSFETs with respect to the input signal change according to the supplied control voltages respectively. The change in the apparent threshold value of each MOSFET makes it possible to positively bring the MOSFET to an off state. It is thus possible to prevent an unnecessary current from flowing in each MOSFET. Since a substrate potential itself is not changed, the possibility that latch-up will occur, will also diminish. Since the inverter is not isolated from Vcc and GND, the stability of internal data can be also ensured.

[Second embodiment]

Figure 5:
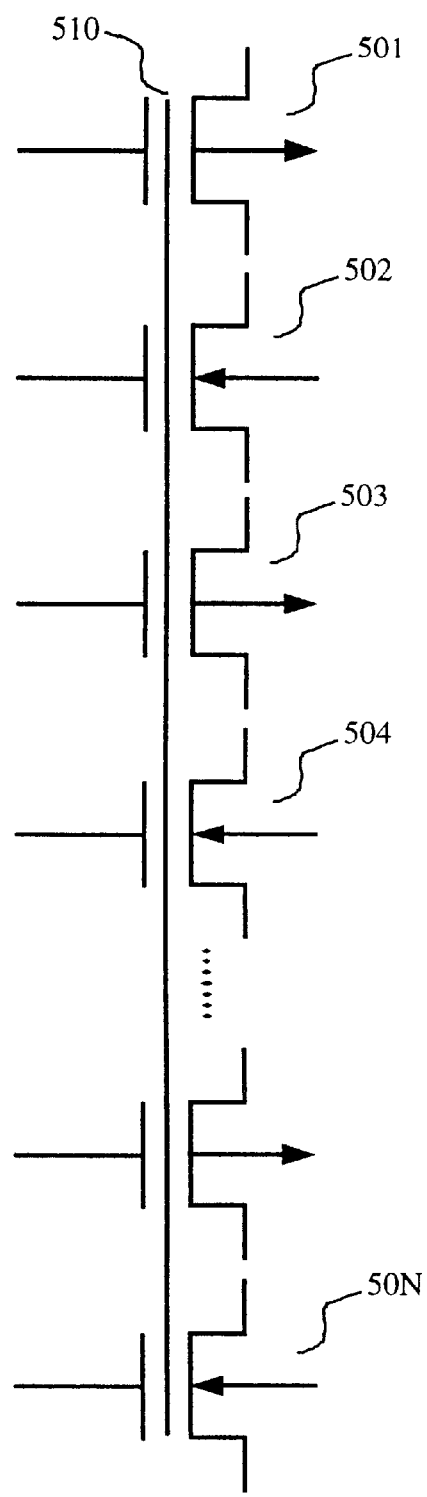
FIG. 5 is a circuit diagram illustrating a second embodiment of the present invention.

FIG. 5 is a circuit diagram showing the concepts of a low power consumption circuit according to a second embodiment of the present invention. The low power consumption circuit comprises N pieces of MOSFETs 501 through 50N. The N pieces of MOSFETs 501 through 50N have one common floating gate 510. At least one MOSFET of the N pieces of MOSFETs is a MOSFET for injecting and discharging carriers into and from the floating gate 510. In the circuit diagram shown in FIG. 5, the MOSFET 501 serves as a P MOSFET for injection of positive holes and the MOSFET 502 serves as an N MOSFET for injection of electrons.

A normally-used input signal is supplied to control gates of the MOSFETs other than the carrier-injecting MOSFETs 501 and 502.

Particularly when no carriers are injected into the floating gate 510, the respective MOSFETs 503 through 50N respectively perform on and off operations according to voltages applied to their corresponding control gates with their normally-used threshold values defined as the boundaries.

A description will made of the case in which electrons are injected into the floating gate 510.

In order to inject the electrons into the floating gate 510, a high voltage is applied to the control gate of the N MOSFET 502 for electron injection.

The electron-injected floating gate 510 is shared between other MOSFETs 503, 504, etc. Due to the action of the electrons injected into the floating gate, the threshold value of the N MOSFET 504 rises. In other, the N MOSFET 504 is not brought to a conducting state unless a voltage higher than a voltage used particularly when no carriers are injected into the floating gate 510, is supplied to its control gate. On the other hand, the P MOSFET 503 is reduced in threshold value. In other words, the P MOSFET 503 is brought into conduction if a negative voltage lower than a negative voltage used particularly when no carriers are injected into the floating gate 510, is supplied to the control gate thereof.

When the positive holes are injected into the floating gate, the operation opposite to that when the electrons are injected into the floating gate, is performed. Namely, the N MOSFET is reduced in threshold value and the P MOSFET increases in threshold value. Due to the operation, the threshold values of the MOSFETs 503, 504, . . . change with respect to the input signal.

Figure 6:
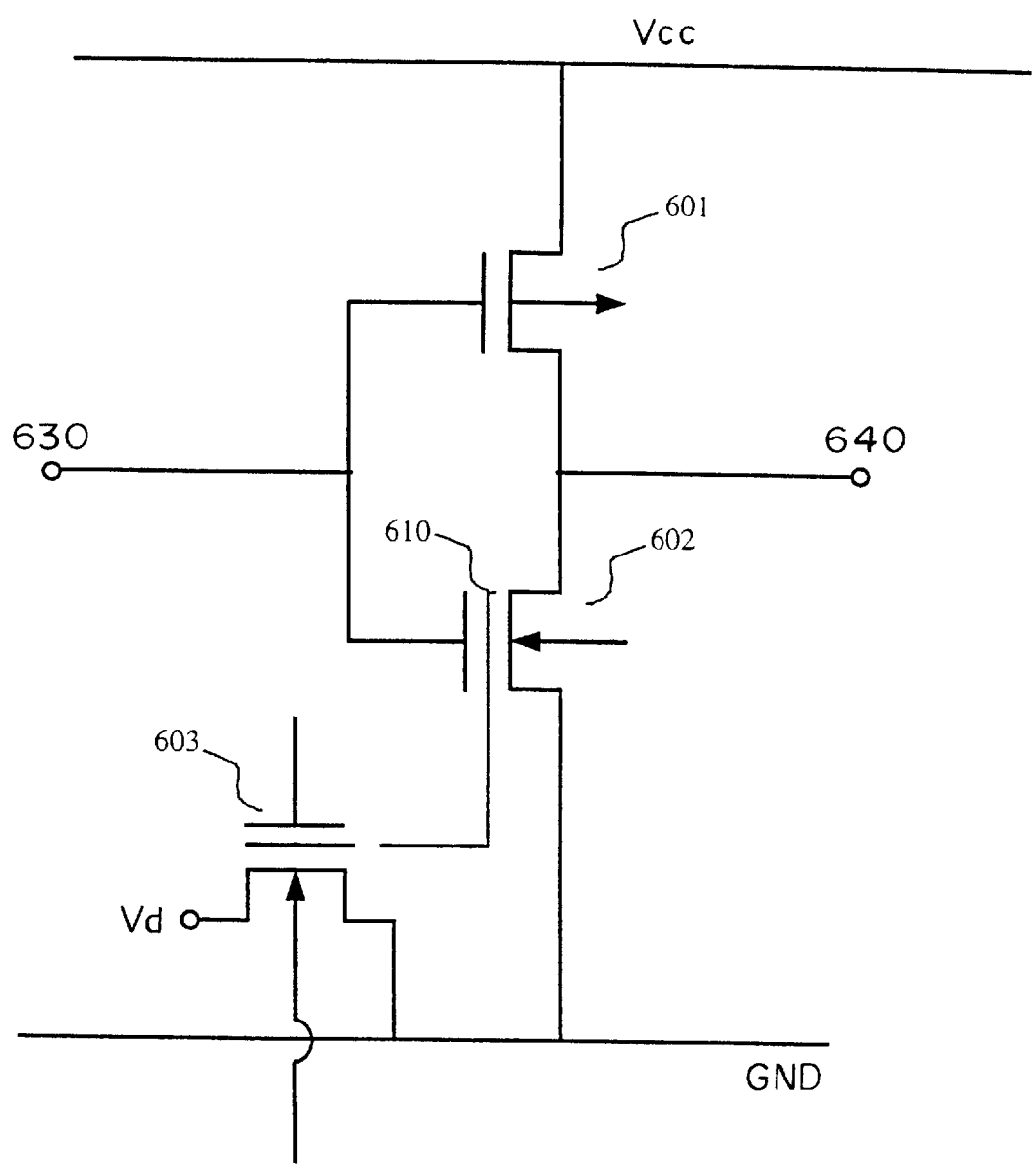
FIG. 6 is a diagram depicting an inverter circuit utilizing the second embodiment of the present invention.

An example of an inverter actually constructed through the use of such characteristics is illustrated in FIG. 6.

The second embodiment of the present invention will be describe below in detail with reference to FIG. 6.

In FIG. 6, the source of a P MOSFET 601 is electrically connected to a source voltage Vcc, the drain thereof is electrically connected to an output terminal 640, and the gate thereof is electrically connected to an input terminal 630.

The N MOSFET 602 is an N MOSFET having a floating gate 610. The floating gate is used in common with the floating gate 610 of another N MOSFET 603.

The source of the N MOSFET 602 is electrically connected to GND, the drain thereof is electrically connected to the output terminal 610, and the gate thereof is electrically connected to the input terminal 630. The other N MOSFET 603 serves as a MOSFET for injection and discharge of carriers and has a control gate used in common with that of the N MOSFET 602. A control voltage generating circuit (not shown) is electrically connected to the control gate of the MOSFET 603. The source of the MOSFET 603 is electrically connected to GND and the drain thereof is electrically connected to a node having a predetermined voltage Vd.

The control voltage generating circuit outputs a predetermined high voltage when electrons are injected into the floating gate 610 and outputs a predetermined negative voltage when the electrons are discharged or withdrawn from the floating gate 610. During a period other than such voltage output periods, the control voltage generating circuit outputs such a voltage as not to bring the MOSFET 603 into conduction. The normal operation of the inverter shown in FIG. 6 will be explained. The electrons are taken from the floating gate 610 by applying a negative voltage to the control gate of the MOSFET 603 before the inverter enters into the normal operation.

Since the threshold value of the N MOSFET 602 becomes low when the electrons are taken from the floating gate 610, a signal supplied to the input terminal 630 can be placed under high-speed operation.

Before the inverter enters into a standby state, a positive voltage is supplied to the control gate of the N MOSFET 603 to inject the electrons into the floating gate 610. When the electrons are injected into the floating gate 610 as described above, the threshold value of the N MOSFET 602 increases. Therefore, the inverter is stably brought to an off state even upon standby, so that no small leakage current floes therein.

While the present invention has been described with reference to the illustrative embodiments, the description is not intended to be construed in a limiting sense. Variuos modifications of the illustrative embodiments, as well as other embodiments of the invention, will be apparent to those skilled in the art on reference to tthis description. It is therefore contemplated that the appended claims will cover any such modifications or embodiments as fall within the true scope of the invention.

What is claimed is:

1. A method of economizing power consumption of a semiconductor integrated circuit, comprising when said semiconductor integrated circuit operates normally, supplying a first predetermined voltage to a control gate of a first MOS transistor and injecting a first conduction type carrier to a floating gate of said first MOS transistor;

supplying an input signal to a control gate of a second MOS transistor having a floating gate common to said first MOS transistor; and when said semiconductor integrated circuit is in a standby state, supplying a second predetermined voltage to the control gate of said first MOS transistor and injecting a second conduction type carrier into the floating gate of said first MOS transistor to thereby increase a threshold value of said second MOS transistor with respect to the input signal.

2. A semiconductor integrated circuit, comprising:

a first MOS transistor including:
  a first electrode;
  a second electrode;
  a first floating gate, and
  a first control gate to which an input signal is supplied; and a second MOS transistor including:
  a third electrode and a fourth electrode, connected to receive a nonzero voltage thereacross,
  a second floating gate commonly connected to said first floating gate, and
  a second control gate to which a control signal is supplied;
  wherein the control signal changes a threshold value of said first MOS transistor when the input signal is supplied to said first control gate.

3. The semiconductor integrated circuit according to claim 2, wherein the control signal decreases the threshold value of said first MOS transistor for the input signal.

4. The semiconductor integrated circuit according to claim 2, wherein carriers are injected from the second control gate into the second floating gate in response to application to the second control gate of the control signal.

5. The semiconductor integrated circuit according to claim 4, wherein the threshold value of said first MOS transistor with respect to the input signal is changed according to an amount of the carriers that is injected into said second floating gate.

6. The semiconductor integrated circuit according to claim 2, wherein the control signal is different than the input signal.

7. The semiconductor integrated circuit according to claim 2, wherein the first MOS transistor is coupled between a power supply potential and the ground potential.

8. The semiconductor integrated circuit according to claim 2, wherein the third electrode is coupled to either the first electrode or the second electrode.

9. The semiconductor integrated circuit according to claim 2, further comprising a ground line connected to the fourth electrode.

10. A semiconductor integrated circuit having a normal state and a standby state, the circuit comprising:

a first MOS transistor having a first control gate and a first floating gate, a second MOS transistor having a second control gate, and a second floating gate common to the first floating gate;

means for supplying an input signal to the second control gate; and means for supplying a first predetermined voltage to the first control gate so as to inject a first conduction type carrier to the first floating gate when the semiconductor integrated circuit is in the normal state, and for supplying a second predetermined voltage to the first control gate so as to inject a second conduction type carrier into the first floating gate when the semiconductor integrated circuit is in the standby state, to thereby increase a threshold value of the second MOS transistor with respect to the input signal.

11. The semiconductor integrated circuit according to claim 10, further comprising means for applying a ground potential to one of a source and a drain of the first MOS transistor while applying a potential other than a ground potential to the other of the source and the drain of the first MOS transistor.

12. A semiconductor integrated circuit operable in a normal state and in a standby state, comprising a first MOS transistor having
  source and drain electrodes connected for receiving a non-zero voltage potential thereacross,
  a first control gate for receiving a first predetermined voltage when the circuit is in the normal state, and for receiving a second predetermined voltage when the circuit is in the standby state, and
  a floating gate for receiving an injection of first conductive type carriers when the first control gate receives the first predetermined voltage and for receiving an injection of second conductive type carriers when the first control gate receives the second predetermined voltage; and a second MOS transistor having a second control gate for receiving an input signal, and having a floating gate common to the floating gate of the first MOS transistor, whereby the injection of the second conductive type carriers increases a threshold value of the second MOS transistors with respect to the input signal.

13. The semiconductor integrated circuit according to claim 12, further comprising a ground line connected to the source of the first MOS transistor.

14. The semiconductor integrated circuit according to claim 13, wherein the second MOS transistor is an N MOSFET having a source connected to the ground line.

* * * * *